United States Patent
Matuoka et al.

[19]

[11] Patent Number: 5,811,884
[45] Date of Patent: Sep. 22, 1998

[54] AUTOMOTIVE ONBOARD LOAD CONTROL APPARATUS AND METHOD

[75] Inventors: Hiroki Matuoka; Masaaki Tanaka, both of Susono; Sigemitu Iisaka, Suntou-gun; Michio Furuhashi, Mishima; Toshinari Nagai, Suntou-gun; Tadayuki Nagai, Gotenba; Takashi Kawai, Atsugi; Kenji Harima, Susono; Yuichi Goto, Susono; Takayuki Otsuka, Susono, all of Japan

[73] Assignee: Toyota Jidosha Kabushiki Kaisha, Aichi, Japan

[21] Appl. No.: 785,447

[22] Filed: Jan. 17, 1997

[30] Foreign Application Priority Data

Jan. 19, 1996 [JP] Japan .................................. 8-007745
Dec. 27, 1996 [JP] Japan .................................. 8-351416

[51] Int. Cl.$^6$ ........................................................ B60L 1/00
[52] U.S. Cl. ............................................ 307/10.1; 60/300
[58] Field of Search ................................... 307/9.1, 10.1, 307/130; 219/202, 205; 322/62–64; 340/455; 361/18, 21; 320/5, 39, 40, 48, 104, 128; 392/485, 491; 60/284, 286, 300

[56] References Cited

U.S. PATENT DOCUMENTS

| 5,404,720 | 4/1995 | Laing ........................................ 60/300 |
| 5,512,789 | 4/1996 | Lyon ........................................ 307/10.1 |
| 5,523,547 | 6/1996 | Miller ...................................... 219/202 |
| 5,645,745 | 7/1997 | Hartwick et al. ......................... 219/202 |

FOREIGN PATENT DOCUMENTS

| 4-362212 | 12/1992 | Japan . |
| 6-17697 | 1/1994 | Japan . |
| 7-208259 | 8/1995 | Japan . |

Primary Examiner—Richard T. Elms
Attorney, Agent, or Firm—Kenyon & Kenyon

[57] ABSTRACT

An onboard load control apparatus and a method for detecting a fault of an onboard electrical load with high accuracy are disclosed. The control apparatus comprises an onboard battery mounted on an automotive vehicle, an electrical heater for electrically heating an electrical load such as an electrically-heated catalyst supplied with power from the onboard battery, an auxiliary relay for turning on/off the power to the electrical heater from the onboard battery, and an ECU for controlling the on/off operation of the auxiliary relay. The apparatus further comprises an engine speed detector for detecting the engine speed of the internal combustion engine and a fault judgement unit for judging whether the electrical heater is normal or faulty on the basis of the fluctuation amount of the engine speed of the internal combustion engine detected by the engine speed detector before and after switching the auxiliary relay. A fault of the electrical load is judged by detecting the voltage across the onboard battery while taking the fluctuation amount of the same voltage into consideration. The apparatus further comprises a load condition holder for holding the load condition of a specific load while the engine speed or the battery voltage is detected.

8 Claims, 12 Drawing Sheets

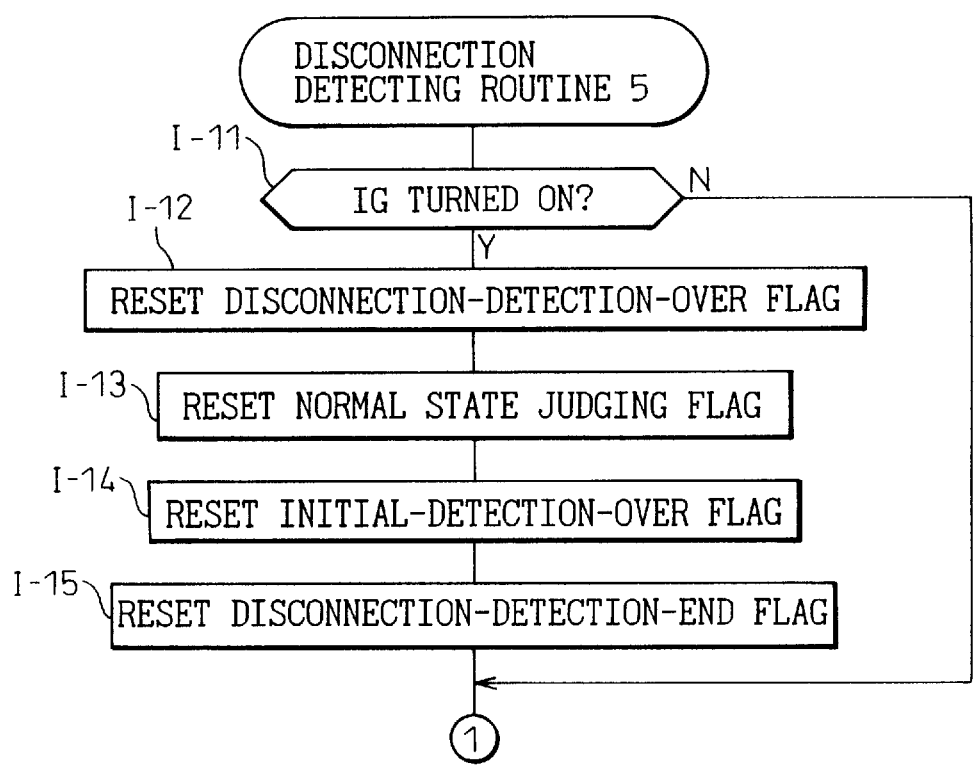

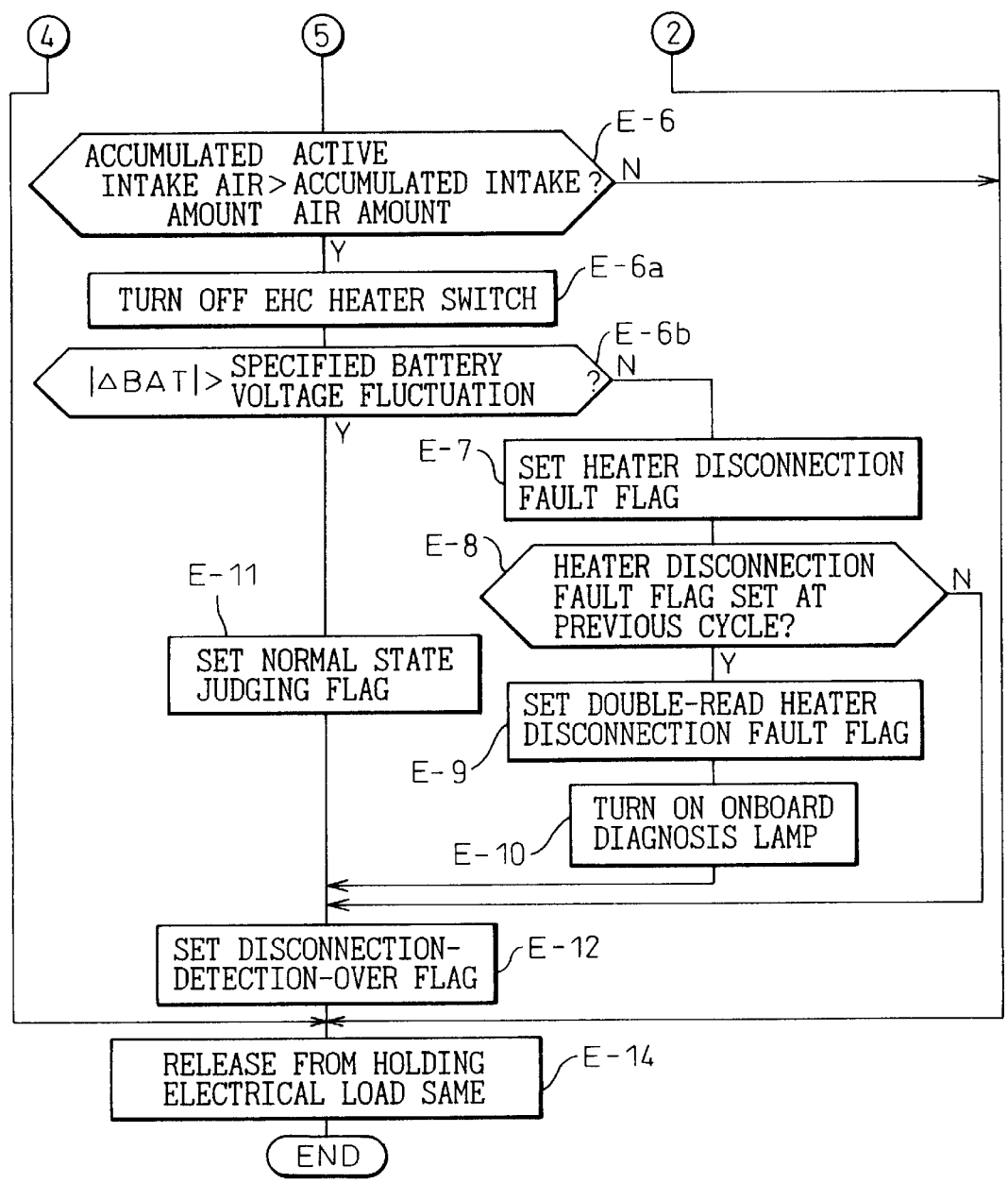

AUTOMOTIVE ONBOARD LOAD CONTROL APPARATUS AND METHOD

BACKGROUND OF THE INVENTION

1. Field of the Invention

The present invention relates to an automotive onboard load control apparatus and a method and, in particular, to an onboard load control apparatus comprising a battery mounted on an automotive vehicle, an electrical load supplied with electric power from the onboard battery, a change-over switch for switching on/off the power to the electrical load from the onboard battery and control means for controlling the on/off state of the change-over switch and a method for controlling the onboard load.

2. Description of the Related Art

The vehicle has electrical loads such as an air conditioner and a rear window heater, and has a battery mounted thereon for supplying electric power to these electrical loads. Also, the electrical heater for heating the catalyst is important especially as an electrical load for cleaning the exhaust gas of the internal combustion engine. If this electrical heater is disconnected, the catalyst cannot clean the exhaust gas until the engine is warmed and the electrical heater is activated by the exhaust gas heated by the engine. During the cold starting time of the engine, activation of the catalyst takes a long time and the exhaust emission is deteriorated.

Specifically, in the case where the electrical heater for heating the catalyst or the electrical circuit from the onboard battery to the electrical heater is disconnected (develops a fault) for some reason, the electrical heater fails to function and it becomes difficult to activate the catalyst at an early time. In order to avoid this inconvenience, the conventional practice is to connect a current-detecting resistor in series to the electrical heater, to provide a disconnection detecting circuit which calculates the current by measuring the voltage across the resistor and judges a disconnection (fault) when the current being supplied from the battery to the electrical heater is not detected, and to replace the disconnected (faulty) electrical heater.

This disconnection detecting circuit, however, requires a circuit for detecting a current, and therefore a current-detecting resistor is required to be mounted within an engine room limited in space and also wiring work is required for mounting the current-detecting resistor.

In view of this, an onboard load control apparatus was proposed by JP-A-7-208259 for detecting a fault of an electrical load such as the electrical heater of the catalyst due to the disconnection of the conductor between the battery and the electrical load without using any current-detecting resistor. This apparatus is adapted to detect the voltage across the onboard battery before and after switching on/off the current to the electrical load from the onboard battery by a change-over switch and judges a fault due to the disconnection of the electrical load based on the fluctuation in the amount of voltage detected.

In the onboard load control apparatus disclosed in JP-A-7-208259, however, the fluctuation of the voltage across the onboard battery before and after switching on/off the current from the onboard battery to the electrical load by the change-over switch is comparatively small. The voltage across the onboard battery undergoes a fluctuation also when a large-capacity load such as an air conditioner is switched. It is therefore difficult to discriminate whether a voltage fluctuation across the onboard battery is caused by a fault of an electrical load, with the result that a detection error is liable to occur.

SUMMARY OF THE INVENTION

Accordingly, the object of the present invention is to solve the above-mentioned problem and to provide an onboard load control apparatus and a method for detecting a fault due to the disconnection of an electrical load mounted on an automotive vehicle with high accuracy.

In order to achieve the above-mentioned object, according to a first aspect of the invention, there is provided an onboard load control apparatus comprising a battery mounted on the vehicle, an electrical load supplied with power from the onboard battery, a change-over switch for switching on/off the power supplied to the electrical load from the onboard battery, control means for controlling the on/off state of the change-over switch, engine speed detection means for detecting the engine speed of the internal combustion engine, and fault judgement means for judging whether the electrical load is normal or faulty on the basis of the amount of fluctuation in the engine speed of the internal combustion engine detected by the engine speed detection means before and after the switching operation of the change-over switch.

In the onboard load control apparatus according to the first aspect, the engine speed (number of revolutions per minute) of the internal combustion engine undergoes a fluctuation when the change-over switch is operated. In the case where the fluctuation in the engine speed is reduced below a predetermined amount due to the disconnection of the conductor between the onboard battery and an electrical load, for example, it is judged that the electrical load is faulty.

In order to achieve the above-mentioned object, according to a second aspect of the invention, there is provided an onboard load control apparatus comprising a battery mounted on the vehicle, an electrical load supplied with power from the onboard battery, a change-over switch operated for turning on/off power to the electrical load from the onboard battery, control means for controlling the on/off state of the change-over switch, engine speed detection means for detecting the engine speed of the internal combustion engine, voltage detection means for detecting the voltage across the onboard battery, and fault judgement means for judging whether the electrical load is normal or faulty on the basis of the amount of fluctuation in the engine speed of the internal combustion engine detected by the engine speed detection means and the amount of fluctuation in the voltage across the onboard battery detected by the voltage detection means before and after the operation of the change-over switch.

The onboard load control apparatus according to the second aspect takes advantage of the fact that the engine speed of the internal combustion engine and the voltage across the onboard battery undergo a fluctuation when the change-over switch is operated. Therefore, in the case where the amount of fluctuation in the engine speed and the amount of fluctuation in the voltage across the battery are both smaller than separate predetermined amounts of fluctuation, respectively, it is judged that the electrical load is faulty. According to this aspect of the invention, the reliability of fault judgement is further improved as compared with the first aspect.

In order to achieve the above-mentioned object of the present invention, according to a third aspect of the invention, there is provided an onboard load control apparatus comprising a battery mounted on the vehicle, an electrical load supplied with power from the onboard battery, a change-over switch operated for turning on/off power to the electrical load from the onboard battery, control means for controlling the on/off state of the change-over switch, first detection means for detecting the degree of fluctuation in a parameter before and after turning the change-over switch from the on to the off state, second detection means for detecting the degree of fluctuation in the same parameter before and after turning the change-over switch from the off to the on state, and fault judgement means for judging whether the electrical load is normal or faulty on the basis of both the degree of fluctuation in the parameter detected by the first detection means and the degree of fluctuation in the parameter detected by the second detection means.

In the onboard load control apparatus according to the third aspect, the degree of fluctuation in a parameter is detected by the first detection means before and after turning the change-over switch from the on to the off state, and the degree of fluctuation in the parameter is detected by the second detection means before and after turning the change-over switch from the off to the on state, and it is judged whether an electrical load is faulty on the basis of these degrees of fluctuation. More specifically, the engine speed of the internal combustion engine and/or the voltage across the onboard battery can be used as such a parameter. These parameters undergo a fluctuation at the time of the first switching operation of turning power to the electrical load from the on to the off state and at the time of the second switching operation of turning power to the electrical load from the off to the on state. The first fluctuation amount and the second fluctuation amount associated with the first switching operation and the second switching operation, respectively, are detected. In the case where the first fluctuation amount and the second fluctuation amount are smaller than a predetermined first amount and a predetermined second amount, respectively, it is judged that the electrical load is faulty. The reliability of fault judgement is further improved as compared with the second aspect.

Also, in each onboard load control apparatus according to the first to third aspects, the fault judgement means includes load condition holding means for holding the condition of a specific one of the electrical loads.

In each onboard load control apparatus according to the first to third aspects, in the case where the change-over switch is turned from the on to the off state or from the off to the on state, the engine speed of the internal combustion engine and the voltage across the onboard battery undergo a fluctuation before and after the operation of the change-over switch. A fluctuation in the load condition of a specific unintended electrical load such as the air conditioner before and after the operation of the change-over switch, however, also causes a fluctuation in the engine speed of the internal combustion engine and the voltage across the onboard battery, thereby making it impossible to judge whether the fluctuation in the revolution speed of the internal combustion engine and the voltage across the onboard battery is attributable to a fault of an intended electrical load or the unintended specific electrical load. In view of this, the load condition of the unintended specific electrical load is held constant, and power is supplied from the onboard battery only to the electrical loads other than the unintended specific electrical load. In this way, the accuracy of detection for judging a fault of an electrical load of each onboard control apparatus according to the first to third aspects is further improved.

According to the first aspect of the invention, there is provided an onboard load control method for an automotive vehicle comprising an onboard battery 5 mounted on the automotive vehicle, at least an electrical load supplied with power from said onboard battery 5, a change-over switch 9 for turning on/off the power supplied to said electrical load from said onboard battery 5, and control means 6 for controlling the on/off operation of said change-over switch 9. The method comprises the steps of detecting the engine speed of said internal combustion engine before and after switching said change-over switch 9 and judging that said electrical load is faulty in the case where the detected fluctuation amount of the engine speed is not more than a predetermined amount.

According to the second aspect of the invention, there is provided an onboard load control method for an automotive vehicle comprising an onboard battery 5 mounted on an automotive vehicle, at least an electrical load supplied with power from said onboard battery 5, a change-over switch 9 for turning on/off the power supplied to said electrical load from said onboard battery 5, and control means 6 for controlling the on/off operation of said change-over switch 9. The method comprises the steps of detecting the fluctuation amount of the engine speed of said internal combustion engine and the fluctuation amount of the voltage across the onboard battery 5 before and after switching said change-over switch 9 and judging that said electrical load is faulty in the case where the fluctuation amount of the detected engine speed is not more than a first predetermined amount and the fluctuation amount of the voltage across said onboard battery 5 is not more than a second predetermined amount.

According to the third aspect of the invention, there is provided an onboard load control method for an automotive vehicle comprising an onboard battery 5 mounted on an automotive vehicle, at least an electrical load supplied with power from said onboard battery 5, a change-over switch 9 for turning on/off the power supplied to said electrical load from said onboard battery 5, and control means 6 for controlling the on/off operation of said change-over switch 9. The method comprises the steps of detecting a first degree of fluctuation of a parameter before and after switching said change-over switch 9 from the on to the off state, detecting a second degree of fluctuation of said parameter before and after switching said change-over switch 9 from the off to the on state, and judging whether said electrical load is normal or faulty on the basis of both said first and second degrees of fluctuation of said parameter.

In each onboard load control method according to the first to third aspects, the specific one of the electrical loads is held in a predetermined electrical load condition.

BRIEF DESCRIPTION OF THE DRAWINGS

The present invention will be more clearly understood from the description as set forth below with reference to the accompanying drawings, wherein:

FIG. 9 is a flowchart for processing at the time of initialization of the disconnection detecting routine according to a fifth embodiment; and FIGS. 10A to 10C show a flowchart for the disconnection detecting routine according to the fifth embodiment.

DESCRIPTION OF THE PREFERRED EMBODIMENTS

The preferred embodiments of the present invention will be described below with reference to the accompanying drawings.

Embodiments of the invention will be described in detail below with reference to the accompanying drawings. In embodiments of the invention, an electrical heating means using an electrically-heated catalyst, that is, an electrical heater is used as an electrical load. The present invention, however, is not limited to such an electrical heater.

Figure 1:
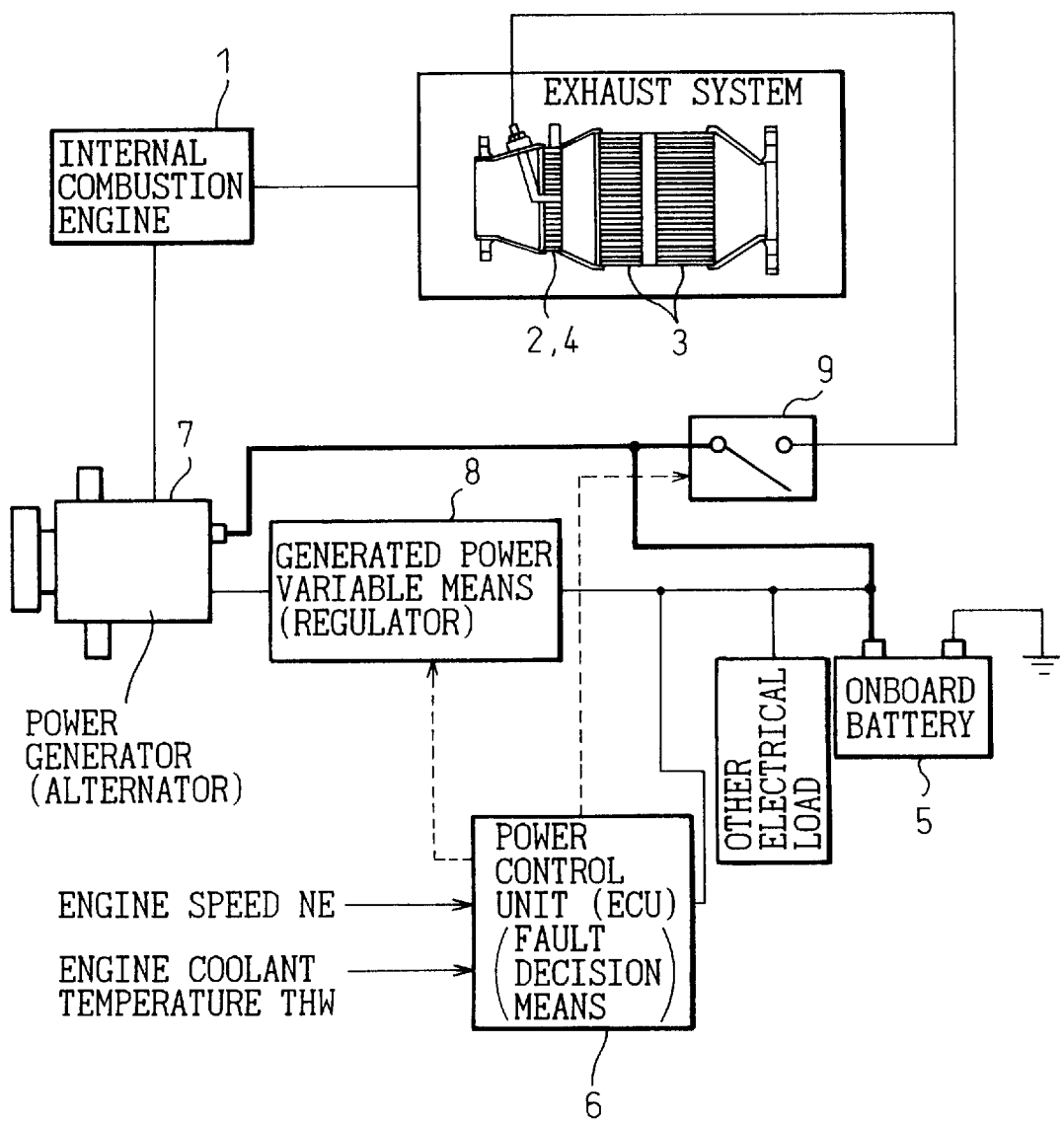
Fig. 1 is a diagram showing a power control unit for a catalyst according to an embodiment of the invention.

FIG. 1 is a diagram showing an onboard load control apparatus according to an embodiment of the invention. The onboard load control apparatus according to the embodiment shown in FIG. 1 comprises an electrically-heated catalyst 2 arranged in an exhaust pipe of an internal combustion engine (hereinafter referred to simply as "the engine"), a three-way catalyst 3 arranged downstream of the electrically-heated catalyst in the exhaust pipe and heated not electrically but by the exhaust gas from the engine 1, electrical heating means 4 for forcibly heating the electrically-heated catalyst 2, and a battery 5 for supplying electric power to the electrical heating means 4. The electrical heating means 4 is integrated with the electrically-heated catalyst 2. A metal is used as a catalyst carrier of the electrically-heated catalyst 2. The metal carrier has an electrical heater structure so that at the time of starting the engine, the metal carrier is supplied with current and heated to increase the catalyst temperature to an activation level within a short time. The power control unit 6 for the catalyst is configured of an electronic control unit ECU as a microcomputer system including, for example, a CPU, a ROM, a RAM, an input interface circuit, an output interface circuit and a bus line connecting them in mutually communicable way.

The battery 5 is kept supplied with power from a power generator 7 driven by the engine 1. A power supply including the generator 7 and the battery 5 supplies power to the power control unit 6, a variable power generation means called a regulator 8, and other electrical loads required for the vehicle. The voltage across the battery 5 is applied to the power control unit 6 thereby to detect the voltage across the battery 5 changing in accordance with the load fluctuation of the battery 5. The power control unit 6 judges whether the electrically-heated catalyst 2 is active or not on the basis of the engine speed NE of the engine 1 calculated from the output signal of a crank angle sensor (not shown) and the coolant temperature THW in the coolant jacket of the engine 1 detected by a coolant temperature sensor (not shown), for example. Only in the case where the judgement is that the electrically-heated catalyst 2 is inactive, the change-over switch (auxiliary relay) 9 is operated in such a manner that power is supplied to the electrical heating means 4 for the electrically-heated catalyst 2 from the power supply including the battery 5 and the generator 7. The regulator 8, on the other hand, is controlled by the power control unit 6, by increasing the field current of the generator 7, to compensate for the voltage drop due to the load fluctuation of the battery 5. The correction of the field current is normally effected by duty cycle control of the conduction time of the field current.

Since the generator 7 supplies power directly to the battery 5, the regulator 8 is also controlled by the power control unit 6 to suppress the field current of the generator 7 and control the output voltage of the generator 7 to below about 13 V in a manner to prevent the battery 5 from breaking down. In the case where the judgement is that the electrically-heated catalyst 2 is active, in contrast, the power control unit 6 causes the auxiliary relay 9 to cut off the power from the power supply to the electrical heating means 4 for the electrically-heated catalyst 2. Now, with reference to a flowchart, explanation will be made about the disconnection detecting routine in the first embodiment of the invention shown in FIG. 1 in which the power control unit 6 judges that a disconnection has occurred in a closed circuit between the battery 5 and the electrical heating means 4 when current ceases to be detected in the closed circuit.

Figure 2:
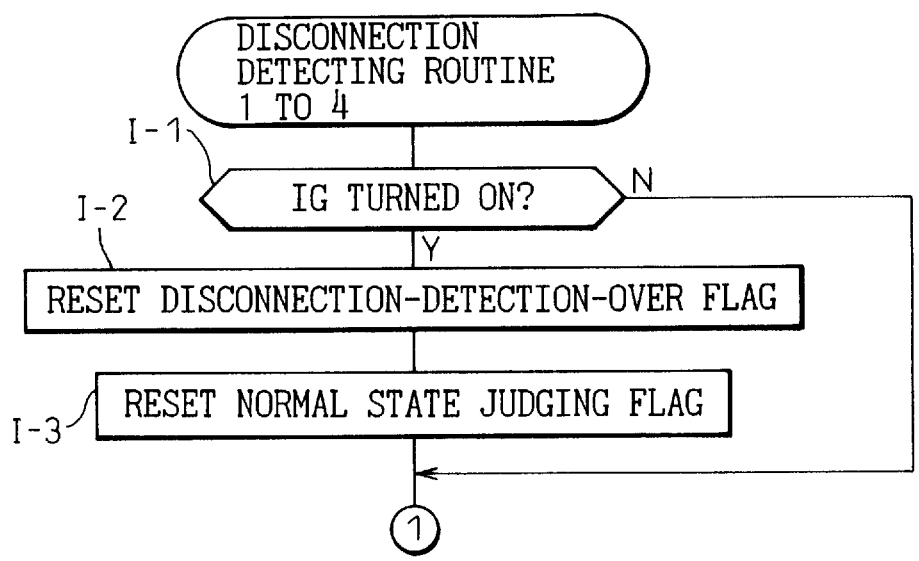
FIG. 2 is a flowchart for processing at the time of initialization of a disconnection detecting routine according to first to fourth embodiments.

FIG. 2 is a flowchart for the process at the time of initialization of the disconnection detecting routine according to the first to fourth embodiments. Step I-1 judges whether the ignition key is turned on and the cranking speed is exceeded. In the case where the judgement in step I-1 is YES, the process proceeds to step I-2, while in the case where the judgement is NO, the process is passed to steps A-1, B-1, C-1 and D-1 in the first, second, third and fourth embodiments, respectively. Step I-2 resets a disconnection-detection-over flag. Step I-3 resets a normal-state judging flag. The disconnection detecting routine according to each embodiment of the invention is executed in cycles of, say, 100 ms. The cycle of connection detecting routine can be quickened to less than 100 ms or retarded to more than 100 ms, or otherwise can be changed appropriately as required.

Figure 3:
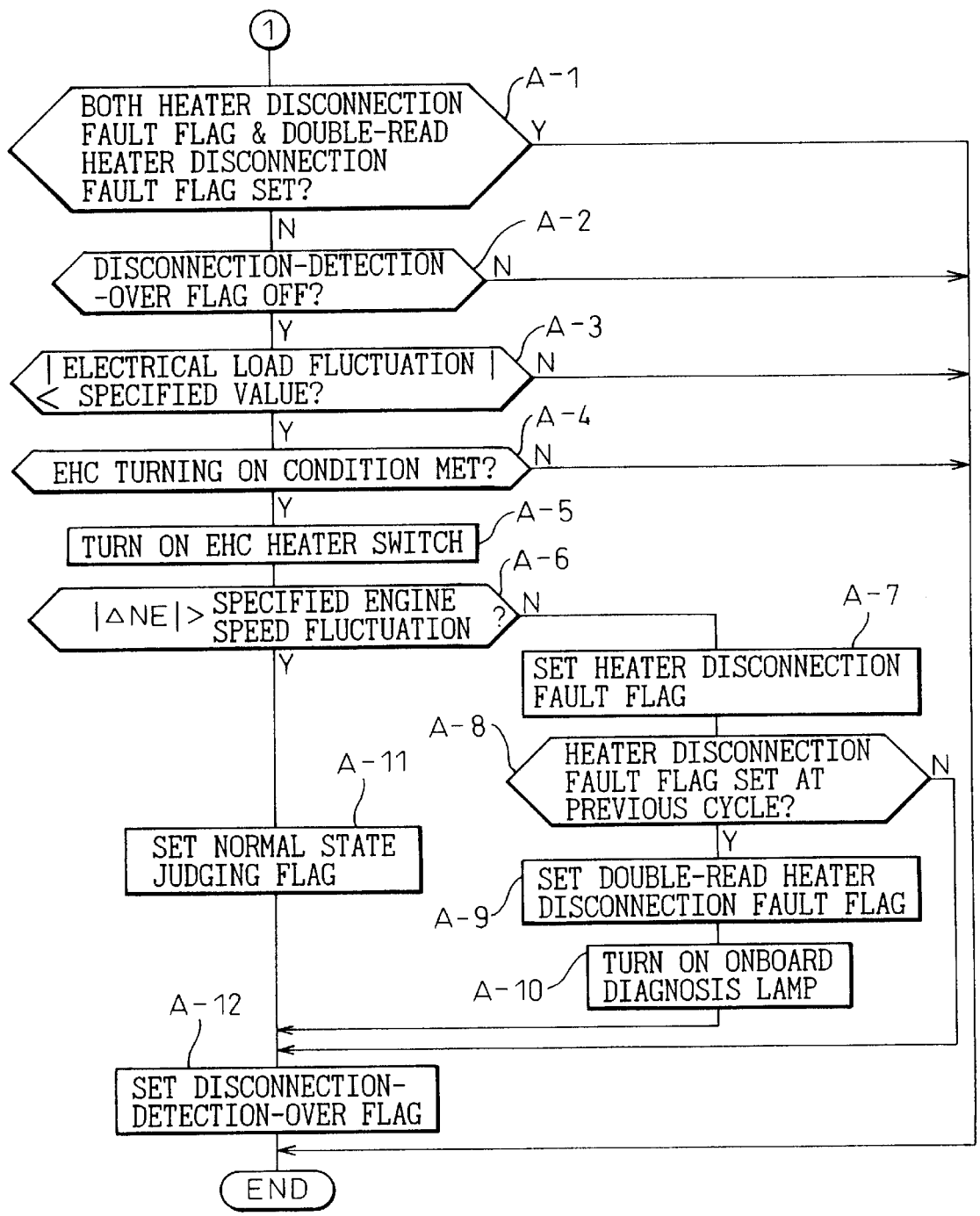
FIG. 3 is a flowchart for the disconnection detecting routine according to the first embodiment.

FIG. 3 is a flowchart for the disconnection detecting routine according to the first embodiment. In the disconnection detecting routine according to the first embodiment, a first fluctuation amount detection means of the above-mentioned catalyst power control unit 6 detects the amount of fluctuation $\Delta NE$ of the engine speed NE of the engine 1 that occurs when the switching operation is performed between an inactive state where the electrically-heated catalyst 2 is not heated by the electrical heating means 4 and an active state where the electrically-heated catalyst 2 is heated by the electrical heating means 4. In the case where the fluctuation amount $\Delta NE$ of the revolution speed NE of the engine 1 is smaller than a predetermined amount even when power is switched to the electrical heating means 4 by the auxiliary relay 9, a first disconnection judgement means judges that a disconnection has occurred in the conductor between the power supply and the electrical heating means 4, or especially, a disconnection has occurred in the electrically-heated catalyst 2.

Figure 4:
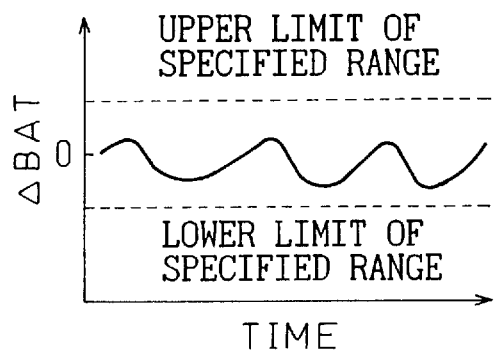
FIG. 4 is a graph showing a change in a voltage fluctuation mount $\Delta BAT_i$ of the battery.

In the flowchart of FIG. 3, step A-1 terminates the routine when a heat disconnection fault flag is set and a double-read heater disconnection fault flag is set. In the case where at least one of the heater disconnection fault flag and the double-read heater disconnection fault flag is reset, on the other hand, the process proceeds to step A-2. Step A-2 judges whether or not the disconnection detection is complete according to whether or not the disconnection-detection-over flag is reset. In the case where the judgement is YES, the process proceeds to step A-3, while when the judgement is NO, the routine is terminated. Step A-3 judges whether or not the fluctuation in the electrical load of the battery 5 is smaller than a specified value, and when the judgement is YES, the process proceeds to step A-4, while when the judgement is NO, the routine is ended. In making this judgement, the voltage BAT across the battery 5 is detected and a battery voltage fluctuation amount $\Delta BAT_i$ (=$BAT_i-BAT_{i-1}$) is calculated for ten cycles, i.e., for one second, for example, from the voltage $BAT_{i-1}$ across the battery 5 in the previous processing cycle and the voltage $BAT_i$ across the battery 5 in the present processing cycle. In the case where the calculated amounts of the voltage fluctuation $\Delta BAT_i$ are all included in a specific range between an upper limit value and a lower limit value, the judgement is YES, while when even one of the amounts of voltage fluctuation $\Delta BAT_i$ calculated during the ten cycles is not included in the specified range, the judgement is NO. FIG. 4 is a diagram plotted by calculating the voltage fluctuation amount $\Delta BAT_i$ of the battery 5 for each 100 ms. FIG. 4 shows the case in which all the calculated amounts of the voltage fluctuation $\Delta BAT_i$ are included in the specified range between an upper limit and a lower limit, that is, the case in which the fluctuation in the electrical load of the battery 5 is smaller than a specified value. In this way, it can be confirmed that there is no large fluctuation in the load of the battery 5 as when the air conditioner is started.

Figure 5:
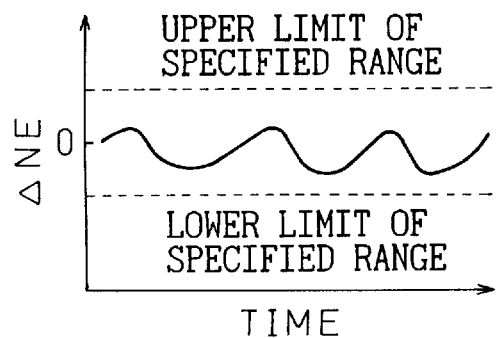
FIG. 5 is a graph showing a change in a fluctuation amount $\Delta NE_i$ of the revolution speed of the internal combustion engine.

Step A-4 judges whether or not the condition for heating the electrically-heated catalyst 2 is met, i.e., whether or not the engine speed NE of the engine 1 is equal to or higher than a predetermined level and the temperature of the coolant is 35° or less. In the case where the judgement is YES, the process proceeds to step A-5, while when the judgement is NO, the routine is terminated. The reference coolant temperature may be other than 35° as required. Step A-5 activates the electrical heating means 4, i.e., turns on the auxiliary relay 9. Step A-6 judges whether or not the fluctuation $\Delta NE$ of the engine speed NE of the engine 1 is larger than a predetermined amount. In the case where the judgement is YES, the process proceeds to step A-11, while when the judgement is NO, the process proceeds to step A-7. In the process of this judgement, the engine speed NE of the engine 1 is detected from the number of revolutions per minute (r.p.m) of the engine, and engine speed fluctuation amount $\Delta NE_i$ (=$NE_i-NE_{i-1}$) is calculated for 100 cycles, i.e., for 10 seconds, for example, from the engine speed $NE_{i-1}$ for the previous processing cycle and the engine speed $NE_i$ for the present processing cycle. In the case where all the calculated engine speed fluctuation amounts $\Delta NE_i$ exceed an upper limit or a lower limit of a specified range, the judgement is YES, while when at least one of the calculated engine speed fluctuation amounts $\Delta NE_i$ is included in the specified range during the 100 cycles, the judgement is NO. FIG. 5 is a diagram plotted by calculating the engine speed fluctuation amount $\Delta NE_i$ of the engine 1 for each 100 ms. FIG. 5 shows the case in which all the calculated engine speed fluctuation amounts $\Delta NE_i$ of the engine 1 are included between the upper limit and the lower limit of the specified range, i.e., the case in which the engine speed fluctuation of the engine 1 is smaller than a specified value.

In the case where the heater disconnection fault flag is set in response to a single judgement of NO in step A-6, even a transient engine speed fluctuation may lead to an erroneous diagnosis of disconnection detection. In view of this, a counter CUT is provided which is adapted to be cleared between steps I-1 and I-2 at the time of initialization described in FIG. 2 and adapted to count up between steps A-6 and A-7. A flowchart is configured in such a manner that unless the count on the counter CUT fails to reach 3 even when the judgement in step A-6 is NO, for example, the process proceeds to step A-11 but not to step A-7. The count reading 3 on the counter CUT indicates the lapse of 0.3 sec since the processing cycle is 100 ms. In other words, only after the judgement in step A-6 continues to be NO for 0.3 second, does the process proceed to step A-7 where the heater disconnection fault flag is set. As a result, the heater disconnection fault detection is made possible in which an erroneous determination of disconnection detection is eliminated in case of a transient engine speed fluctuation.

Step A-7 sets the heater disconnection fault flag. Step A-8 judges whether or not the heater disconnection fault flag is set in the previous processing cycle of the routine. In the case where the judgement is YES, the process proceeds to step A-9, while when the judgement is NO, the process proceeds to step A-12. Step A-9 sets a double-read heater disconnection fault flag recognizing the occurrence of a heater disconnection in the case where the judgement in step A-8 is that the heater disconnection fault flag is set in the previous processing cycle of the routine and also in the case where the judgement in step A-7 is that the heater disconnection fault flag is set in the present processing cycle of the routine. In other words, step A-9 sets the double-read heater disconnection fault flag for firmly recognizing the occurrence of a heater disconnection fault when the heater disconnection fault flag is set twice successively. Step A-10 turns on a vehicle fault diagnosis (onboard diagnosis) display lamp (not shown) for notifying the vehicle driver that the electrical heating means 4 for the electrically-heated catalyst 2 is disconnected.

In the case where the judgement in step A-6 is YES, step A-11 sets the normal-state judging flag. Step A-12 sets the disconnection-detection-over flag thereby to terminate the routine. In the flowchart shown in FIG. 3, once the disconnection-detection-over flag is set in step A-12, the judgement in step A-2 becomes NO from the next and subsequent processing cycles. Thus the routine is terminated without executing the heater disconnection detection. In other words, the heater disconnection detection process is performed only once after the engine starts. Consequently, with a flowchart having a timer TIMER for resetting the disconnection-detection-over flag at predetermined time intervals of, say, 30 minutes, the heater disconnection detection process can be executed a plurality of times after the engine starts, and therefore early detection of the heater disconnection is made possible.

Figure 6:
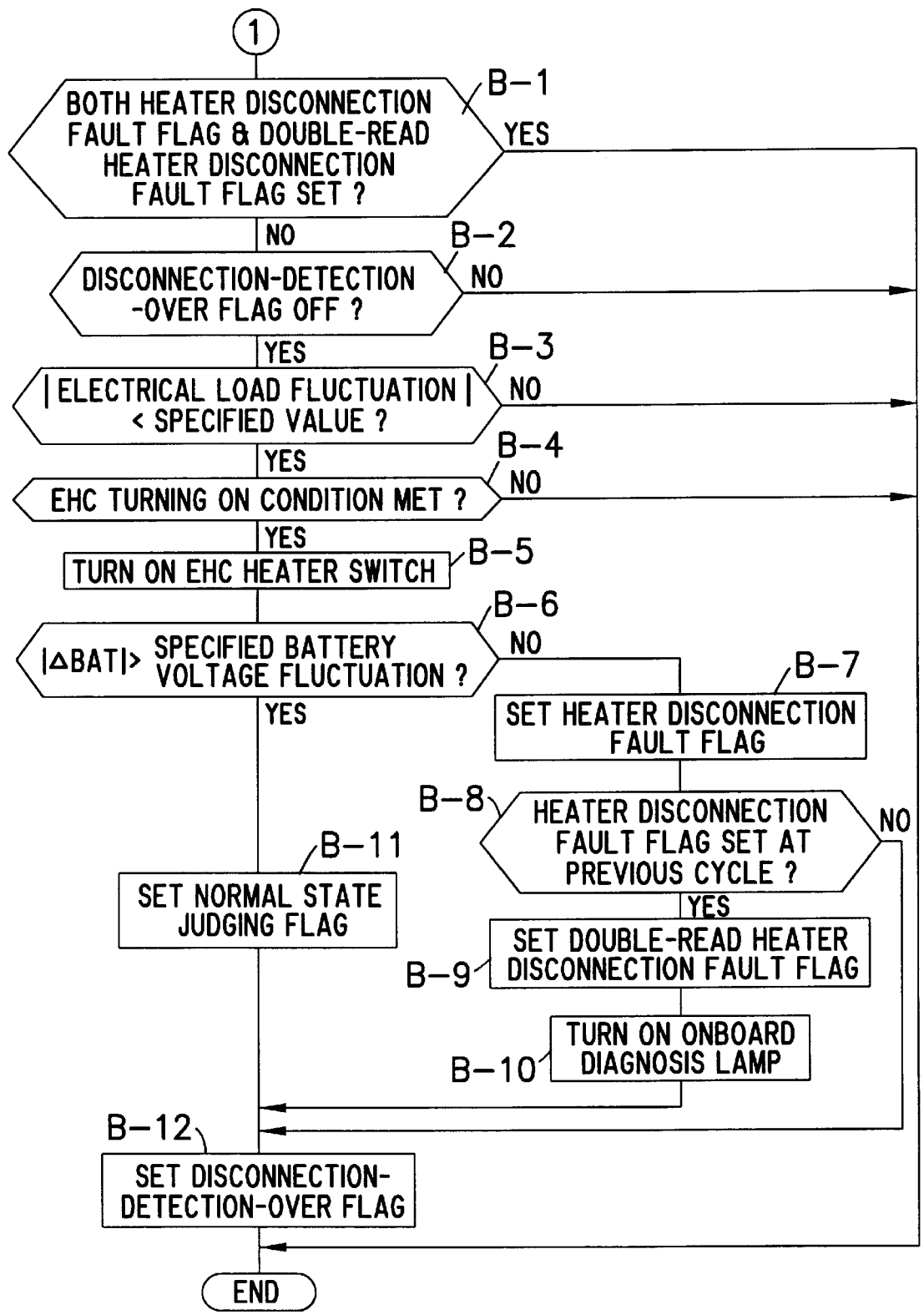
FIG. 6 is a flowchart for a disconnection detecting routine according to a second embodiment.

FIG. 6 is a flowchart of the disconnection detecting routine according to a second embodiment. In the disconnection detecting routine according to the second embodiment, the catalyst power control unit 5 causes a second fluctuation amount detection means to detect the voltage fluctuation amount $\Delta BAT$ of the battery 5 generated when switching the heater 4 between an inactive state where the electrically-heated catalyst 2 is not heated and an active state where the electrically-heated catalyst 3 is heated. In the case where the voltage fluctuation $\Delta BAT$ of the battery 5 is smaller than a predetermined amount in spite of the fact that power supplied to the electrical heating means 4 is switched by the auxiliary relay 9, a second disconnection judgement means judges that a disconnection has occurred in a closed circuit of current between the power supply and the electrical heating means 4, or especially, a disconnection has occurred within the electrically-heated catalyst 2.

The only difference of the flowchart of FIG. 6 from the flowchart of first embodiment shown in FIG. 3 lies in step B-6. Step B-6 alone therefore will be described below. Step B-5 activates the electrical heating means to the heating mode, that is, turns on the auxiliary relay 9. Step B-6 judges whether the fluctuation $\Delta BAT$ of the voltage across the battery 5 is larger than a predetermined amount. In the case where the judgement is YES, the process proceeds to step B-11, while when the judgement is NO, the process proceeds to step B-7. In the process of this judgement, as described in step A-3 of FIG. 3 with reference to FIG. 5, the voltage BAT across the battery 5 is detected, and the battery voltage fluctuation $\Delta BAT_i$ ($=BAT_i-BAT_{i-1}$) is calculated for 100 cycles, i.e., for ten seconds from the voltage $BAT_{i-1}$ across the battery 5 in the previous processing cycle and the voltage $BAT_i$ across the battery 5 in the present processing cycle. In the case where all the calculated voltage fluctuations $\Delta BAT_i$ exceed an upper limit or a lower limit of a specified range, the judgement is YES and the process proceeds to step B-11. In the case where even one of the calculated voltage fluctuations $\Delta BAT_i$ is included in the specified range for any one of 100 cycles, on the other hand, the judgement is NO, and the process proceeds to step B-7.

Figure 7:
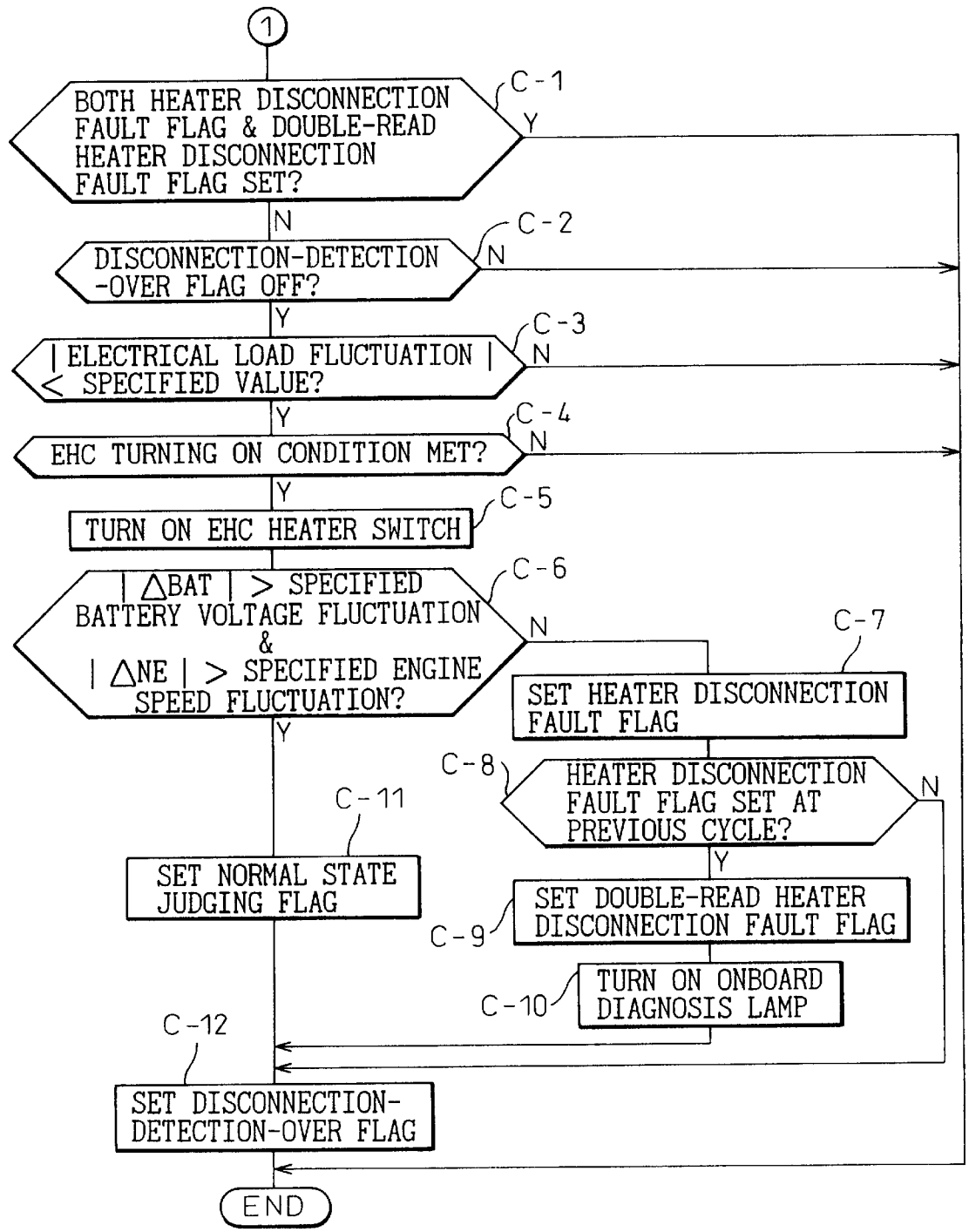
FIG. 7 is a flowchart for a disconnection detecting routine according to a third embodiment.

FIG. 7 is a flowchart showing a disconnection detecting routine according to a third embodiment. In the disconnection detecting routine according to the third embodiment, a third fluctuation amount detection means of the catalyst power control unit 5 described above detects a fluctuation amount $\Delta NE$ of the engine speed NE of the engine 1 and a fluctuation amount $\Delta BAT$ of the voltage BAT across the battery 5 generated when the electrical heating means (heater) 4 is switched between an inactive state where the electrically-heated catalyst 2 is not heated and an active state where the electrically-heated catalyst 2 is heated. In the case where the fluctuation amount $\Delta NE$ of the engine speed NE of the engine 1 is smaller than a predetermined value and the fluctuation amount $\Delta BAT$ of the voltage BAT across the battery 5 is smaller than a predetermined value in spite of the fact that power supplied to the electrical heating means 4 by the auxiliary relay 9 is switched, then a third disconnection judgement means judges that a disconnection has occurred within a closed circuit of current between the power supply and the electrical heating means 4, or especially within the electrically-heated catalyst 2.

The only difference of the flowchart of FIG. 7 from the flowchart according to the first embodiment shown in FIG. 3 lies in step C-6. Step C-6 alone therefore will be explained. Step C-5 sets the electrical heating means 4 in active mode, i.e., turns on the auxiliary relay 9. Step C-6 detects the voltage BAT across the battery 5. The battery voltage fluctuation amount $\Delta BAT_i$ ($=BAT_i-BAT_{i-1}$) is calculated for 100 cycles, i.e., for ten seconds, for example, from the voltage $BAT_{i-1}$ across the battery 5 in the previous processing cycle and the voltage $BAT_i$ across the battery 5 in the present processing cycle. Step C-6 also detects the engine speed NE of the engine 1. The engine speed fluctuation amount $\Delta NE_i$ ($=NE_i-NE_{i-1}$) is calculated for 100 cycles, i.e., for ten seconds, for example, from the engine speed $NE_{i-1}$ for the previous processing cycle and the engine speed $NE_i$ for the present processing cycle. In the case where all the calculated voltage fluctuation amounts $\Delta BAT_i$ are included between an upper limit and a lower limit of a specified range and at the same time in the case where all the calculated engine speed fluctuation amounts $\Delta NE_i$ are included between an upper limit and a lower limit of a specified range, then the judgement is YES, and the process proceeds to step C-11. In the case where even a single calculated voltage fluctuation amount $\Delta BAT_i$ or a single calculated engine speed fluctuation amount $\Delta NE_i$ assumes a value outside of the respective specified range during the ten cycles, on the other hand, the judgement is NO, and the process proceeds to step C-7. As described above, according to the third embodiment, the disconnection of the electrical heating means 4 is detected from both the engine speed fluctuation of the engine 1 and the voltage fluctuation of the battery 5, and therefore the reliability is improved.

Figure 8A:
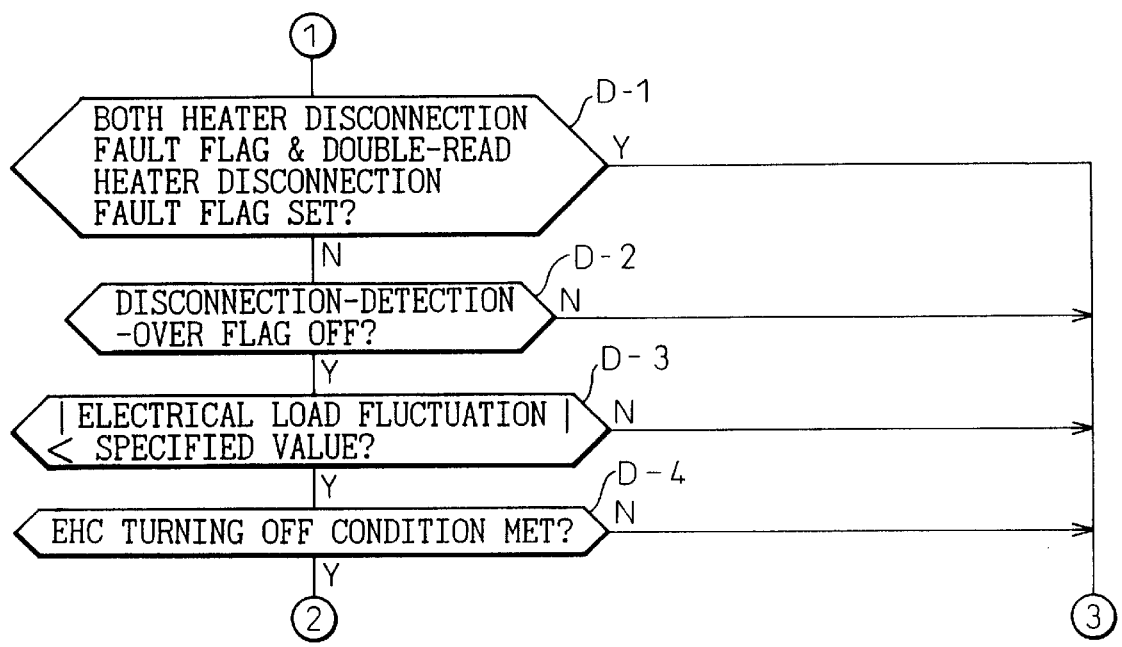
FIGS. 8A and 8B show a flowchart for a disconnection detecting routine according to a fourth embodiment.
Figure 8B:
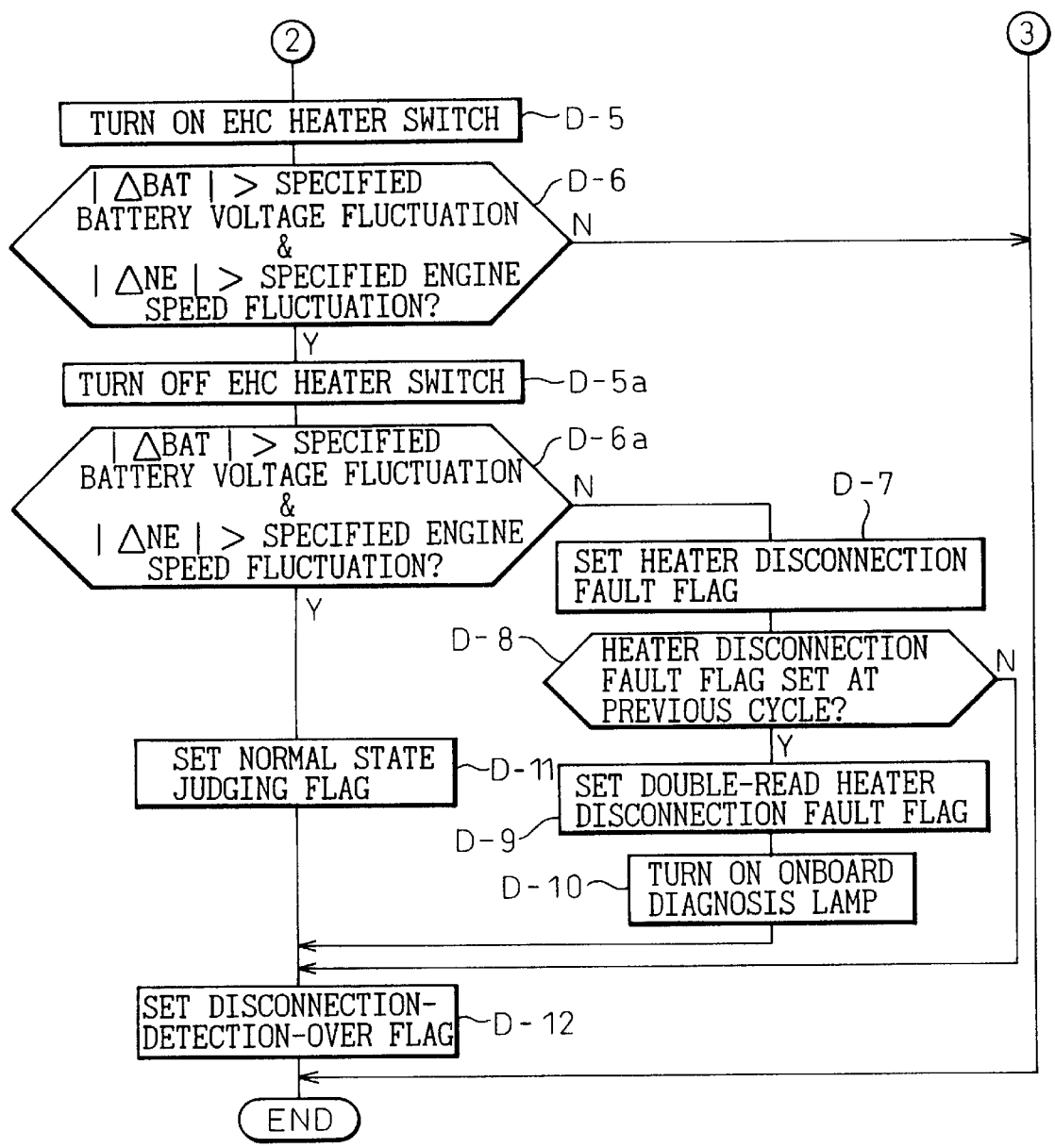

FIGS. 8A and 8B show a flowchart for the disconnection detecting routine according to a fourth embodiment. In the disconnection detecting routine according to the fourth embodiment, a fourth fluctuation amount detection means of the catalyst power control unit 5 detects a first engine speed fluctuation amount of the engine 1 and a first voltage fluctuation amount of the battery 5 generated when the electrical heating means (heater) 4 is switched from an inactive state where the electrically-heated catalyst 2 is not heated to an active state where the electrically-heated catalyst 2 is heated. The fourth fluctuation amount detection means further detects a second engine speed fluctuation amount and a second voltage fluctuation amount of the battery 5 generated when the electrical heating means 4 is switched from the active to the inactive state. Suppose that the first engine speed fluctuation amount of the engine 1 is smaller than a predetermined value, that the first voltage fluctuation amount of the battery 5 is smaller than a predetermined value, that the second engine speed fluctuation amount of the engine 1 is smaller than a predetermined amount and that the second voltage fluctuation amount of the battery 5 is smaller than a predetermined amount in spite of the fact that electrical heating means 4 is switched from the inactive to the active state or from the active to the inactive state. In that case, a fourth disconnection judgement means judges that a disconnection has occurred in the conductor between the power supply and the electrical heating means 4 or, especially, within the electrically-heated catalyst 2.

The difference of the flowchart of FIGS. 8A and 8B from the flowchart according to the third embodiment shown in FIG. 7 lies in that in the case where the judgement in step D-6 is NO, the disconnection detecting routine is terminated, and in that in the case where the judgement in step D-6 is YES, on the other hand, steps D-5a and D-6a are executed instead of proceeding to step D-7. The difference further lies in that in the case where the judgement in step D-6a is YES, the process proceeds to step D-11, while when the judgement in step D-6a is NO, the process proceeds to step D-7. Because of these differences, steps D-5a and D-6a alone will be explained. Step D-5a sets the electrical heating means 4 in an inactive state, i.e., turns off the auxiliary relay 9. Step D-6a judges whether or not the voltage fluctuation amount $\Delta BAT$ of the battery 5 is larger than a predetermined value and also whether or not the fluctuation amount $\Delta NE$ of the engine speed NE is larger than a predetermined value as described with reference to step C-6 in the flowchart of FIG. 7 like step D-6. In the case where the foregoing two judgements are both YES, the process proceeds to step D-11, while when at least one of the two judgements is NO, the process proceeds to step D-7. In the process of this judgement, as in step A-3 described above with reference to FIG. 4, the voltage BAT across the battery 5 is detected, and the battery voltage fluctuation amount $\Delta BAT_i$ ($=BAT_i-BAT_{i-1}$) is calculated for 100 cycles, i.e., for ten seconds, for example, from the voltage $BAT_{i-1}$ across the battery 5 in the previous processing cycle and the voltage $BAT_i$ across the battery 5 in the present processing cycle. In the case where all the calculated voltage fluctuations $\Delta BAT_i$ exceed an upper limit or a lower limit of a specified range, the judgement is YES, and the process proceeds to step D-11. In the case where even a single calculated voltage fluctuation amount $\Delta BAT_i$ is included within the specified range, then the judgement is NO and the process proceeds to step D-7. According to the fourth embodiment, as described above, a disconnection of the electrical heating means 4 is detected from both the fluctuation in the engine speed of the engine 1 and the fluctuation in the voltage across the battery 5 both in the case where the electrical heating means 4 transfers from inactive state to active state and in the case where it transfers from active state to inactive state. The reliability of disconnection detection thus is further improved.

In the above-mentioned disconnection detecting routine according to the fourth embodiment, both the engine speed of the internal combustion engine and the voltage across the onboard battery are used as parameters but only one of them may be used as a parameter.

FIG. 9 is a flowchart for the processing at the time of initialization of the disconnection detecting routine according to a fifth embodiment. Step I-11 judges whether or not the ignition key is turned on and whether or not the cranking speed has been exceeded. In the case where the judgement in step I-11 is YES, the process proceeds to step I-12 but when the judgement in step I-11 is NO, the process proceeds to step E-1. Step I-12 resets the disconnection-detection-over flag. The disconnection-detection-over flag indicates that the disconnection detecting routine is actually executed and the disconnection judgement is completed. Step I-13 resets the normal-state judging flag. Step I-14 resets the initial-detection-over flag. Step I-15 resets the disconnection-detection-end flag. The disconnection-detection-end flag determines whether or not the disconnection detecting routine is to be executed.

Figure 10A:
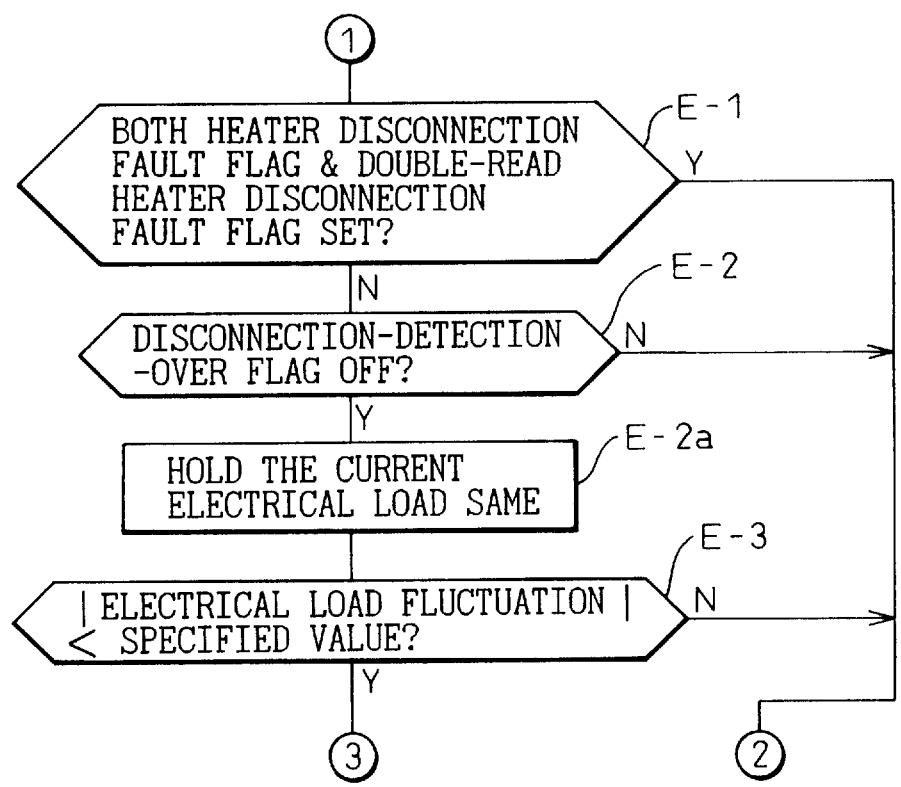
Figure 10B:
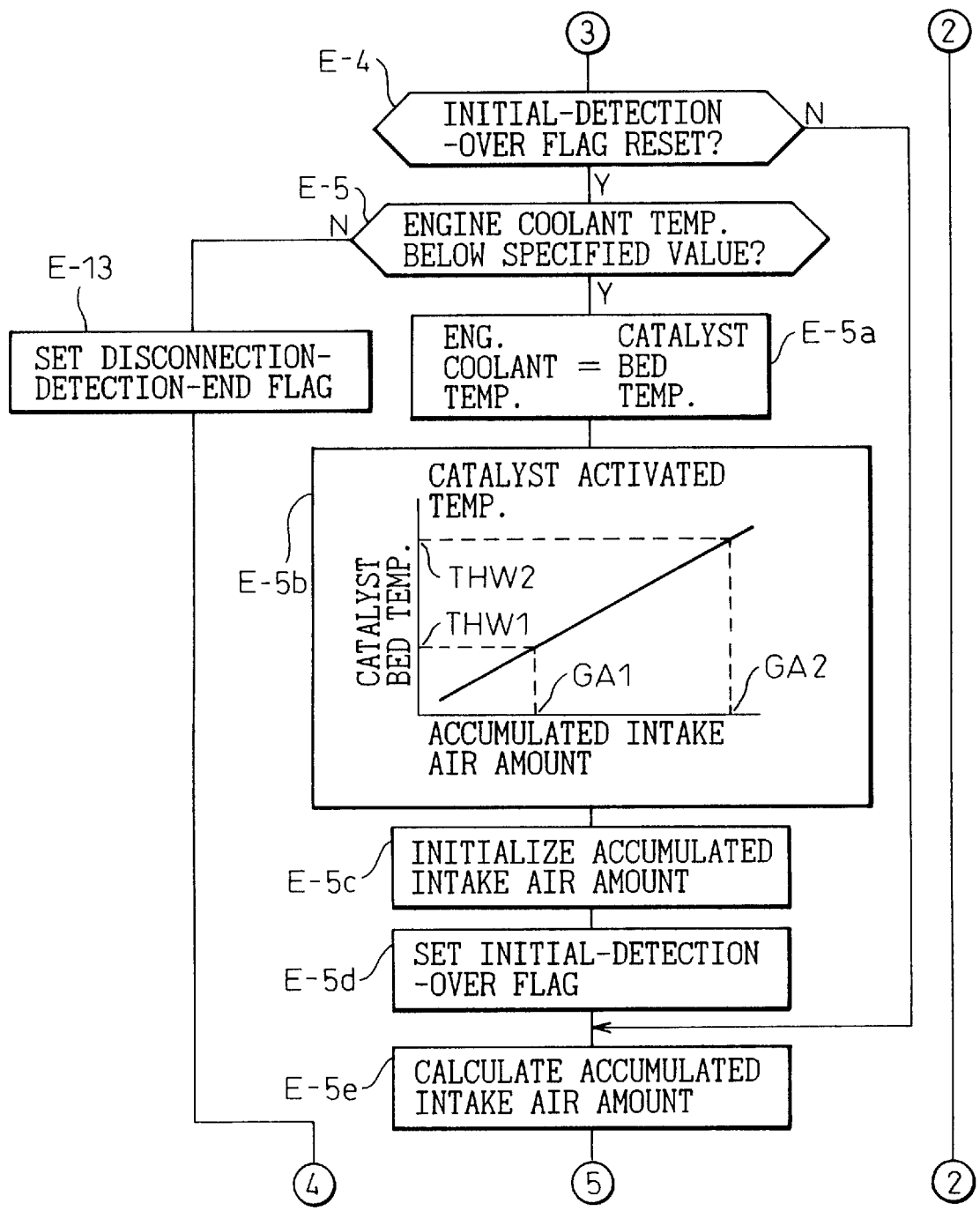

FIGS. 10A to 10C show a flowchart for the disconnection detecting routine according to the fifth embodiment. In the disconnection detecting routine according to the fifth embodiment, the electrical heating means (heater) 4 of the catalyst power control unit 6 is switched between an inactive state where the electrically-heated catalyst 2 is not heated and an active state where the electrically-heated catalyst 2 is heated, i.e., that power supplied to the electrical heating means 4 is switched by the auxiliary relay 9. At the time of switching power mentioned above, the electrical loads other than the electrical heating means 4 are held by a load condition holding means in such a condition as to keep constant the power supplied to the electrical loads other than the electrical heating means 4.

The difference of the flowcharts of FIGS. 10A to 10C from the flowchart according to the first embodiment shown in FIG. 3 lies in steps E-2a, E-4, E-5, E-5a to E-5e, E-6, E-6a, E-6b, E-13 and E-14. Only these steps, therefore, will be explained below. First, step E-2a holds the operation of the electrical loads other than the electrical heating means 4 in such a manner that the processing in steps E-6a, E-6b described later are not affected by the fluctuation in the electrical loads other than the electrical heating means 4. Specifically, the on/off operation of the electrical loads such as the defogger (the electrical heater for the rear window) and the air conditioner that consume a large amount of power is made impossible by holding the on/off state of the output interface circuit of the power control unit 6. Also, an electrical signal is sent to the air conditioner thereby to make each operation of the air conditioner impossible. Next, an explanation will be made of the process of steps E-4 to E-6b for detecting an active state of the electrically-heated catalyst 2 and thus detecting the disconnection of the electrical heating means 4.

Step E-4 judges whether or not the initial detection flag indicating the execution of initialization of the accumulated air amount is reset or not. In the case where the initial detection flag is reset, the process proceeds to step E-5, while when the initial detection flag is set, the process proceeds to step E-5e. Step E-5 judges whether or not the coolant temperature THW of the engine 1 is at or below a specified level. In the case where the coolant temperature THW of the engine 1 is at or below the specified level, it is judged that the engine 1 is cold starting, and the process proceeds to step E-5a. In the case where the coolant temperature THW of the engine 1 exceeds the specified level, on the other hand, it is judged that the engine 1 is warming up, and the process proceeds to step E-13. Step E-13 sets the disconnection-detection-end flag and terminates the disconnection detecting routine. The above-mentioned specified value is set within the range of ±10° of the detection temperature on the air-intake temperature sensor of the engine 1. Step E-5a assumes that the coolant temperature of the engine 1 is equal to the catalyst bed temperature, and sets the coolant temperature THW of the engine 1 at the bed temperature of the electrically-heated catalyst 2.

Step E-5b calculates the accumulated intake air amount required to activate the electrically-heated catalyst 2 from the shown map stored in the RAM. This map is used for calculating the bed temperature of the electrically-heated catalyst 2 with respect to the accumulated air-intake amount determined experimentally. Step E-5b calculates an active accumulated intake air amount (=GA2−GA1) required for activation of the electrically-heated catalyst 2 from an accumulated intake air amount GA1 corresponding to the bed temperature THW1 of the electrically-heated catalyst 2 in the particular processing cycle and an accumulated intake air amount GA2 corresponding to the temperature THW2 at which the electrically-heated catalyst 2 is activated. Step E-5c initializes, i.e., resets to zero, the accumulated intake air amount in the previous cycle. Step E-5d sets the initial-detection-over flag indicating that the initialization of the accumulated intake air amount is executed. Immediately after completion of step E-5d, the process proceeds to step E-5e. After the initial-detection- over flag is set in step E-5d, the judgement in step E-4 is NO and the process proceeds to step E-5e. In step E-5e, the intake air amount (grm/sec) which is normally read in the main routine in 1 msec is read in the present processing cycle, and an accumulated intake air amount is calculated by adding the intake air amount to the accumulated intake air amount calculated up to the previous processing cycle.

Step E-6 detects that the catalyst bed temperature has increased to an activation level from the fact that the accumulated intake air amount has reached the active accumulated intake air amount described above. Specifically, step E-6 compares the accumulated intake air amount calculated in step E-5e to the active accumulated intake air amount calculated from the map in step E-5b, and in the case where the accumulated intake air amount is larger than the active accumulated intake air amount, the process proceeds to step E-6a, while in the case where the accumulated intake air amount is smaller than or equal to the active accumulated intake air amount, the routine is terminated. Step E-6a returns the electrical heating means 4 to an inactive state, i.e., turns off the auxiliary relay 9. Step E-6b detects the voltage BAT across the battery 5, and calculates the battery voltage fluctuation $\Delta BAT_i$ (=$BAT_i$−$BAT_{i-1}$) over, say, ten cycles from the voltage $BAT_{i-1}$ across the battery 5 in the previous processing cycle and the voltage $BAT_i$ across the battery 5 in the present processing cycle. In the case where all the calculated voltage fluctuations $\Delta BAT_i$ are included between an upper limit and a lower limit of a specified range, the judgement is YES, and the process proceeds to step E-11, while when at least one of the voltage fluctuations $\Delta BAT_i$ is not included within the specified range in the ten cycles, on the other hand, the judgement is NO and the process proceeds to step E-7.

After the disconnection-detection-over flag is set in step E-12, step E-14 releases the electrical loads other than the electrical heating means 4 from the condition held in step E-2a. Specifically, as a result of releasing the output interface circuit of the power control unit 6 from the on-off state in which it has so far been held, the on/off operation of the electrical loads such the air conditioner and the defogger, which consume a large electric power, is made possible again.

The above-mentioned embodiments represent a case in which power is supplied to an electrically-heated catalyst having an electrically-heated structure with a catalyst carrier made of metal configured as an electric heater. The electrical load according to the present invention, however, is not limited to the means for heating the electrically-heated catalyst, but is applicable also to the electrical heating means (heater) and other electrical loads disposed in the neighborhood of the catalyst carrier.

In the onboard load control apparatus according to the first to third embodiments of the invention, a fault in the electrical loads such as a disconnection can be detected with a higher accuracy.

In the onboard load control apparatus according to the fourth embodiment of the invention, on the other hand, it is possible to avoid the detection of a fault of an electrical load other than the electrical heating means such as an erroneous disconnection detection attributable to a fluctuation in such an electrical load.

It will be understood by those skilled in the art that the foregoing descriptions are preferred embodiments of the disclosed apparatus and that various changes and modifications may be made in the invention without departing from the spirit and scope thereof.

We claim:

1. An onboard load control apparatus comprising:

an onboard battery mounted on an automotive vehicle;

an electrical load supplied with power from the onboard battery;

a change-over switch coupled between the onboard battery and the electrical load;

control means for controlling the operation of the change-over switch to switch the change-over switch between an ON state in which power is supplied from the onboard battery to the electrical load and an OFF state in which power is not supplied from the onboard battery to the electrical load;

engine speed detection means for detecting the engine speed of an internal combustion engine; and fault judgment means for judging whether the electrical load is normal or faulty on the basis of an amount of fluctuation of the engine speed detected by the engine speed detection means before and after the switching operation of the change-over switch.

2. An onboard load control apparatus comprising:

an onboard battery mounted on an automotive vehicle;

an electrical load supplied with power from the onboard battery;

a change-over switch coupled between the onboard battery and the electrical load;

control means for controlling the operation of the change-over switch to switch the change-over switch from an ON state in which power is supplied from the onboard battery to the electrical load and an OFF state in which power is not supplied from the onboard battery to the electrical load;

engine speed detection means for detecting the engine speed of an internal combustion engine, voltage detection means for detecting the voltage across the onboard battery, and fault judgment means for judging whether the electrical load is normal or faulty on the basis of an amount of fluctuation of the engine speed detected by the engine speed detection means and an amount of fluctuation of the voltage across the onboard battery detected by the voltage detection means before and after the switching operation of the change-over switch.

3. An onboard load control apparatus comprising:

an onboard battery mounted on an automotive vehicle;

an electrical load supplied with power from the onboard battery;

a change-over switch coupled between the onboard battery and the electrical load;

control means for controlling the operation of the change-over switch to switch the change-over switch from an ON state in which power is supplied from the onboard battery to the electrical load and an OFF state in which power is not supplied from the onboard battery to the electrical load;

first detection means for detecting a first degree of fluctuation of a parameter before and after a first switching operation in which the change-over switch is switched from the ON state to the OFF state;

second detection means for detecting a second degree of fluctuation of the parameter before and after a second switching operation in which the change-over is switched from the OFF state to the ON state; and fault judgment means for judging whether the electrical load is normal or faulty on the basis of the first and second degrees of fluctuation.

4. An onboard load control apparatus according to one of claims 1 to 3, wherein the fault judgment means includes load condition holding means for holding the condition of the electrical load.

5. An onboard load control method for an automotive vehicle comprising an onboard battery mounted on the automotive vehicle, at least an electrical load supplied with power from said onboard battery, a change-over switch for turning on/off the power supplied to said electrical load from said onboard battery, and control means for controlling the on/off operation of said change-over switch, said method comprising the steps of detecting the engine speed of said internal combustion engine before and after switching said change-over switch and judging that said electrical load is faulty in the case where the detected fluctuation amount of the engine speed is not more than a predetermined amount.

6. An onboard load control method for an automotive vehicle comprising an onboard battery mounted on an automotive vehicle, at least an electrical load supplied with power from said onboard battery, a change-over switch for turning on/off the power supplied to said electrical load from said onboard battery, and control means for controlling the on/off operation of said change-over switch, said method comprising the steps of detecting the fluctuation amount of the engine speed of said internal combustion engine and the fluctuation amount of the voltage across the onboard battery before and after switching said change-over switch and judging that said electrical load is faulty in the case where the fluctuation amount of the detected engine speed is not more than a first predetermined amount and the fluctuation amount of the voltage across said onboard battery is not more than a second predetermined amount.

7. An onboard load control method for an automotive vehicle comprising an onboard battery mounted on an automotive vehicle, at least an electrical load supplied with power from said onboard battery, a change-over switch for turning on/off the power supplied to said electrical load from said onboard battery, and control means for controlling the on/off operation of said change-over switch, said method comprising the steps of detecting a first degree of fluctuation of a parameter before and after switching said change-over switch from the on to the off state, detecting a second degree of fluctuation of said parameter before and after switching said change-over switch from the off to the on state, and judging whether said electrical load is normal or faulty on the basis of both said first and second degrees of fluctuation of said parameter.

8. An onboard load control method according to any one of claims 5 to 7, wherein said specific one of said electrical loads is held in a predetermined electrical load condition.

* * * * *